(12) United States Patent
Hsu et al.

(10) Patent No.: US 7,378,286 B2
(45) Date of Patent: May 27, 2008

(54) SEMICONDUCTIVE METAL OXIDE THIN FILM FERROELECTRIC MEMORY TRANSISTOR

(75) Inventors: Sheng Teng Hsu, Camas, WA (US); Tingkai Li, Vancouver, WA (US); Jong-Jan Lee, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 277 days.

(21) Appl. No.: 10/922,712

(22) Filed: Aug. 20, 2004

(65) Prior Publication Data

US 2006/0038242 A1    Feb. 23, 2006

(51) Int. Cl.
*H01L 29/72* (2006.01)
(52) U.S. Cl. .................. 438/3; 438/85; 438/102; 438/104; 438/142; 438/149; 438/197
(58) Field of Classification Search ............ 438/3, 438/85, 102, 104, 142, 149, 197
See application file for complete search history.

(56) References Cited

U.S. PATENT DOCUMENTS

| | | | |
|---|---|---|---|
| 3,832,700 A | 8/1974 | Wu et al. | |
| 5,293,510 A | 3/1994 | Takenaka | |
| 5,303,182 A | 4/1994 | Nakao et al. | |
| 5,365,094 A | 11/1994 | Takasu | |
| 5,383,088 A | 1/1995 | Chapple-Sokol et al. | |
| 5,621,681 A | 4/1997 | Moon | |
| 5,623,439 A * | 4/1997 | Gotoh et al. ............ | 365/145 |
| 5,731,608 A | 3/1998 | Hsu et al. | |
| 5,744,374 A | 4/1998 | Moon | |
| 5,777,356 A | 7/1998 | Dhote et al. | |
| 5,798,903 A | 8/1998 | Dhote et al. | |
| 5,812,442 A | 9/1998 | Yoo | |
| 5,932,904 A | 8/1999 | Hsu et al. | |
| 5,942,776 A | 8/1999 | Hsu et al. | |
| 5,962,884 A | 10/1999 | Hsu et al. | |
| 6,011,285 A | 1/2000 | Hsu et al. | |

(Continued)

OTHER PUBLICATIONS

Huilin Ren, Curent-Voltage Characteristics of a Semiconductor Metal Oxide Sensor, Master Thesis, Electrical Engineer, The University of Main, 2001, pp. 1-12.

*Primary Examiner*—Edward Wojciechowicz
(74) *Attorney, Agent, or Firm*—David C. Ripma

(57) ABSTRACT

The present invention discloses a novel transistor structure employing semiconductive metal oxide as the transistor conductive channel. By replacing the silicon conductive channel with a semiconductive metal oxide channel, the transistors can achieve simpler fabrication process and could realize 3D structure to increase circuit density. The disclosed semiconductive metal oxide transistor can have great potential in ferroelectric non volatile memory device with the further advantages of good interfacial properties with the ferroelectric materials, possible lattice matching with the ferroelectric layer, reducing or eliminating the oxygen diffusion problem to improve the reliability of the ferroelectric memory transistor. The semiconductive metal oxide film is preferably a metal oxide exhibiting semiconducting properties at the transistor operating conditions, for example, $In_2O_3$ or $RuO_2$. The present invention ferroelectric transistor can be a metal-ferroelectric-semiconductive metal oxide FET having a gate stack of a top metal electrode disposed on a ferroelectric layer disposed on a semiconductive metal oxide channel on a substrate. Using additional layer of bottom electrode and gate dielectric, the present invention ferroelectric transistor can also be a metal-ferroelectric-metal (optional)-gate dielectric (optional)-semiconductive metal oxide FET.

13 Claims, 15 Drawing Sheets

U.S. PATENT DOCUMENTS

| | | |
|---|---|---|
| 6,018,171 A | 1/2000 | Hsu et al. |
| 6,069,381 A | 5/2000 | Black et al. |
| 6,117,691 A | 9/2000 | Hsu et al. |
| 6,140,173 A | 10/2000 | Wolters et al. |
| 6,146,904 A | 11/2000 | Hsu et al. |
| 6,151,240 A | 11/2000 | Suzuki |
| 6,214,724 B1 | 4/2001 | Nakajima |
| 6,225,655 B1 | 5/2001 | Moise et al. |
| 6,274,916 B1 * | 8/2001 | Donath et al. ............... 257/410 |
| 6,362,499 B1 | 3/2002 | Moise et al. |
| 6,420,742 B1 | 7/2002 | Ahn et al. |
| 6,498,362 B1 | 12/2002 | Forbes et al. |
| 6,503,763 B2 | 1/2003 | Li et al. |
| 6,531,325 B1 | 3/2003 | Hsu et al. |
| 6,538,273 B2 | 3/2003 | Willer et al. |
| 6,555,879 B1 * | 4/2003 | Krivokapic et al. ......... 257/382 |
| 2005/0059172 A1 * | 3/2005 | Kim .............................. 438/3 |

* cited by examiner

SEMICONDUCTIVE METAL OXIDE THIN FILM FERROELECTRIC MEMORY TRANSISTOR

FIELD OF THE INVENTION

This invention related generally to semiconductor device and nonvolatile memory transistor, and more particularly to ferroelectric gate transistor structures and methods of fabrication.

BACKGROUND OF THE INVENTION

Ferroelectric materials are composed of many randomly-distributed permanently polarized regions. Under the presence of an electric field, the regions with a polarization component in the direction of the electric field grow at the expense of the non-aligned regions so that a net polarization can result. If the electric field decreases, the polarization also decreases but at a slower rate so that even when the electric field becomes zero, a remnant polarization remains. This remnant polarization, existed under zero field condition (i.e., when power is turned off), is the basis of ferroelectric nonvolatile memory devices such as ferroelectric transistors.

The ferroelectric transistor is typically a ferroelectric-gate-controlled semiconductor field-effect transistor (FET), which employs a ferroelectric film in contact with a silicon substrate, and in which a proper polarization of the ferroelectric film can create an inversion layer in the silicon channel of the transistor. The basic ferroelectric-gate controlled field-effect transistor is a metal-ferroelectric silicon (MFS) FET. The term MFS represents the layers in the gate stack of the ferroelectric transistor, consisting a metal (M) gate electrode disposed on a ferroelectric (F) gate dielectric on the silicon (S) channel of the transistor.

However, effective transistor operation of the above MFS transistor is difficult to achieve due to the requirement of the ferroelectric/silicon interface. When a ferroelectric film is deposited directly on the silicon substrate, metals and oxygen from the ferroelectric layer may diffuse into the ferroelectric-silicon interface, creating interface trapped charges which affect the polarization of the ferroelectric film, and overall may make the operation of the ferroelectric transistor unstable. Further, since the thermal expansion coefficient and lattice structure of a ferroelectric film is not compatible with silicon, it is very difficult to form a high-quality ferroelectric film with a clean interface directly on the silicon substrate.

Various designs have been proposed to address the drawbacks posed by the direct ferroelectric/silicon interface such as the addition of an interface layer such as a gate dielectric, a metal layer, a conductive metal oxide or a doped conductive metal oxide between the ferroelectric film and the silicon substrate.

The gate dielectric interface design can overcome the surface interface and surface state issues of a ferroelectric layer in contact with the silicon substrate, but they incorporate other difficulties such as higher operation voltage and trapped charges in the bottom floating gate layer. The operation voltage of these transistors is higher than the ferroelectric layer programming voltage by an amount of the voltage across the gate dielectric. And when there is a voltage applied across the ferroelectric thin film, there will be current flow in the gate stack, and charges would be trapped in this floating electrode. The trapped charges may neutralize the polarization charges at the interface of the bottom electrode and the ferroelectric film and could shorten the memory retention time of this structure.

The metal interface design is based on the formation of a Schottky diode in a metal-ferroelectric-metal silicon (MFMS) device. A Schottky barrier is formed between the bottom metal electrode of the gate unit (or a very shallow junction layer) and the silicon substrate. The Schottky ferroelectric gate memory transistor requires a space between the bottom electrode and the source and drain region and a very shallow n-channel under the gate, therefore the drive current of the Schottky ferroelectric gate memory transistor can be relatively low.

Other novel ferroelectric transistor designs employ a conductive oxide, a conductive metal oxide or a doped conductive metal oxide interfacial layer between the ferroelectric material and the silicon substrate, as disclosed in co-pending application entitled "Conductive metal oxide gate ferroelectric memory transistor", and "$In_2O_3$ thin film resistivity control by doping metal oxide insulator for MFMox device applications" of the same first inventors, hereby incorporated by reference. A conductive oxide interface layer does not have the drawbacks of a dielectric interface layer, and may not have the drawbacks of the metal interface layer of a Schottky diode formation. The conductive oxide interfacial layer may improve the quality of the ferroelectric film and the operation of the ferroelectric transistor by possible lattice matching with the ferroelectric layer, reducing or eliminating the oxygen diffusion problem at the ferroelectric interface to improve the reliability of the ferroelectric transistor, and possible etch selectivity improving with other dielectric and metal films.

Despite the obvious advantages of the conductive oxide, prior art ferroelectric transistor designs all employ a silicon conduction channel, leading to relatively complicated device fabrication process, together with the difficulty in 3D integration.

SUMMARY OF THE INVENTION

Under appropriate conditions, certain conductive metal oxide materials behave as a semiconductor, and therefore the present invention discloses a novel transistor structure employing semiconductive metal oxide as the transistor conductive channel. By replacing the silicon conductive channel with a semiconductive metal oxide channel, the transistors can achieve simpler fabrication process and could realize 3D structure to increase circuit density.

The disclosed semiconductive metal oxide transistor can have great potential in ferroelectric non volatile memory device. Besides the simpler fabrication process and possible 3D structure for higher memory density, the present invention ferroelectric semiconductive metal oxide transistor can provide good interfacial properties with the ferroelectric materials, possibly improving the ferroelectric film quality and reducing floating gate effect by omitting the gate dielectric. The semiconductive metal oxide further can have the advantages of possible lattice matching with the ferroelectric layer, reducing or eliminating the oxygen diffusion problem at the ferroelectric interface to improve the reliability of the ferroelectric transistor, and possible etch selectivity improvement with other dielectric and metal films.

The semiconductive metal oxide film is preferably a metal oxide exhibiting semiconducting properties at the transistor operating conditions, for example, $In_2O_3$ or $RuO_2$. The semiconductive metal oxide film can also be doped with n or p type impurity species to modify the conductivity. By varying the dopant concentration and other fabrication process parameters, the semiconductive metal oxide film can achieve the proper properties such as the ability to change resistance as a function of applied field suitable for the operation and optimization of the ferroelectric transistor performance.

The present invention ferroelectric transistor can be a metal-ferroelectric-semiconductive metal oxide FET. The gate stack of this transistor has a top metal electrode (or top gate) disposed on a ferroelectric layer disposed on a semiconductive metal oxide channel on a substrate. The present invention ferroelectric transistor can be a metal-ferroelectric-metal-semiconductive metal oxide FET. The gate stack of this transistor has a top metal electrode (or top gate) disposed on a ferroelectric layer disposed on a bottom metal electrode (or bottom gate) disposed on a semiconductive metal oxide channel on a substrate. The present invention ferroelectric transistor can also include a gate dielectric or a resistive oxide on the semiconductive metal oxide channel such as a metal-ferroelectric-gate dielectric-semiconductive metal oxide FET or a metal-ferroelectric-metal-gate dielectric-semiconductive metal oxide FET.

The fabrication process of the present invention ferroelectric transistor can be performed by a gate etching process or by a replacement gate process. In the gate etching process, the multilayer gate stack is deposited and etched, while in the replacement gate process, a replacement gate stack is deposited as a place holder for the fabrication of other portions of the device, then the replacement gate stack is removed and the functional gate stack is deposited.

DETAILED DESCRIPTION OF THE INVENTION

The present invention discloses a transistor structure having a semiconductive metal oxide substrate as the conductive channel. By replacing the silicon conductive channel with a semiconductive metal oxide channel, the transistor device can achieve simpler fabrication process and could realize 3D integration structure to increase circuit density. The transistor having a semiconductive metal oxide channel of the present invention is preferably employed as a ferroelectric non volatile memory field effect transistor.

Metal oxide semiconductors have been used as gas sensing materials because of their high sensitivity to the presence of various gases in the ambient atmosphere. The typical gas sensor operates on the principle that the film resistance of a semiconductor metal oxide film changes significantly upon the chemical reaction between the gas species to be detected and the semiconductor metal oxide sensing film. The film resistance then becomes a direct measurement of the gas concentration. Semiconductor metal oxide gas sensor can be used to detect gases such as CO, alcohol and oxygen.

The high sensitivity of the semiconductor metal oxides is due to their semiconducting properties since semiconductive metal oxides can be classified as poor semiconductors. The conductivity of these oxides can change significantly with the doping of n or p-type impurities and both doped and un-doped semiconducting metal oxides have been studied for gas sensor applications. Typical semiconductor metal oxides utilized in gas detection are molybdenum oxide ($MoO_3$), which possesses excellent catalytic, electrochromic and gas sensing properties, tungsten oxide ($WO_3$) which has been used to detect various gases due to its excellent semiconducting properties, and titanium oxide $TiO_2$ which is photoreactive and change conductivity upon irradiated with light of a given wavelength. Other semiconductor oxide materials suitable for sensor applications are tin oxide ($SnO_2$), iron oxide ($Fe_2O_3$), indium oxide ($In_2O_3$), cesium oxide ($CeO_2$), zinc oxide ($ZnO_2$), gallium oxide ($Ga_2O_3$), $SrTiO$, $LaFeO_3$, $Cr_{1.8}Ti_{0.2}O_3$.

The present invention discloses a transistor employing a semiconductive metal oxide channel, especially a ferroelectric memory transistor, to simplify the fabrication process and to improve the suitability for 3D integration. The ferroelectric transistor of the present invention is a ferroelectric field effect transistor having a semiconductive metal oxide conduction layer replacing the silicon conduction layer. The present invention semiconductive metal oxide transistor comprises a source and a drain regions provided in a semiconductive metal oxide film, and the ferroelectric transistor further comprises a ferroelectric gate structure between the source and drain regions.

Figure 1:
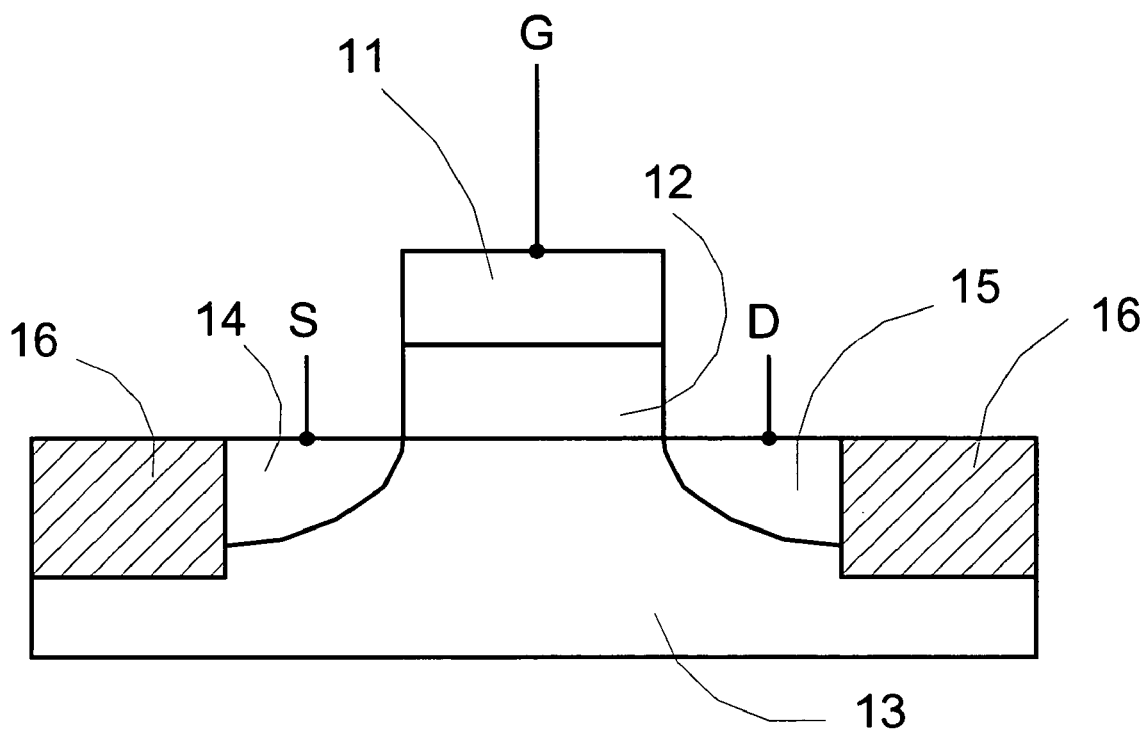
FIG. 1 shows a prior art ferroelectric-gate-controlled semiconductor field-effect transistor (FET) which is a metal-ferroelectric silicon (MFS) FET.

FIG. 1 shows the schematic of a prior art n-channel metal-ferroelectric silicon MFS transistor. A ferroelectric film 12 is formed as a gate insulating film on a p-type silicon substrate 13, together with source 14 and drain 15 regions having a high concentration of n-type impurity ions. A metal gate electrode 11 is formed over the ferroelectric film 12. The MFS transistor is isolated by the isolation trenches 16. The basic drawback of the above ferroelectric transistor is the difficulty in fabricating a good ferroelectric/silicon interface.

Figure 2A:
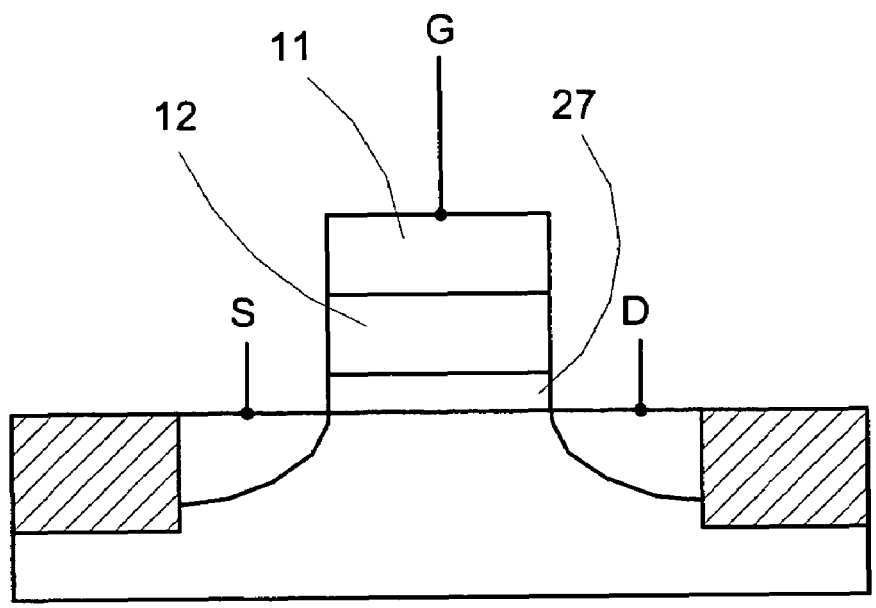
FIG. 2A shows a schematic of a prior art metal-ferroelectric-oxide silicon MFOS transistor.
Figure 2B:
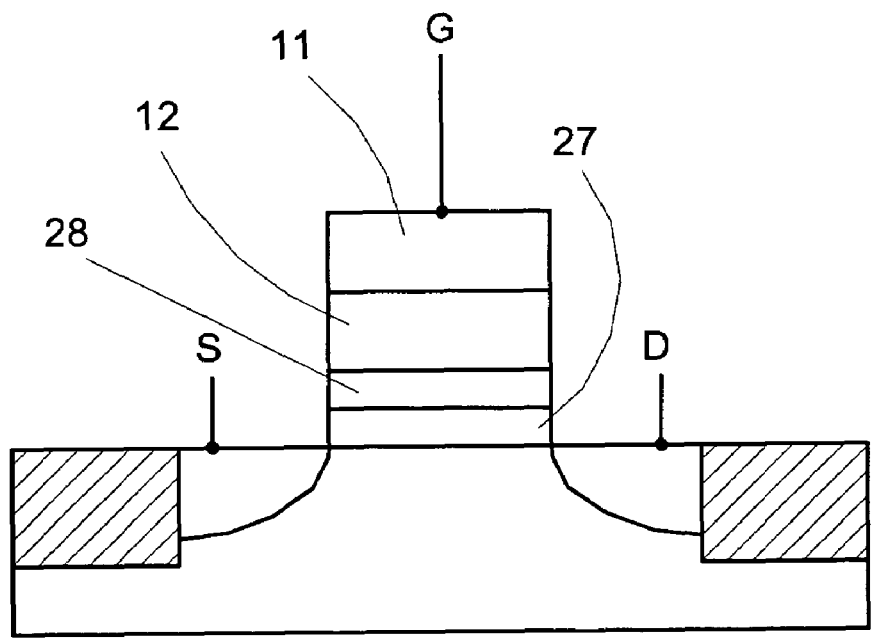
FIG. 2B shows a schematic of a prior art metal-ferroelectric-metal-oxide silicon MFMOS transistor.

To address the drawbacks posed by the direct ferroelectric/silicon interface, a gate dielectric can be inserted between the ferroelectric film and the silicon substrate. The ferroelectric transistor is then called metal-ferroelectric-oxide (or insulator) silicon (MFOS or MFIS) FET. FIG. 2A shows a MFOS memory transistor using a gate oxide layer 27 formed between the silicon substrate 13 and the ferroelectric film 12. Alternatively, a metal floating gate layer 28 can be added between the ferroelectric film 12 and the gate oxide layer 27 as shown in FIG. 2B for a metal-ferroelectric-metal-oxide (or insulator) silicon (MFMOS or MFMIS)

transistor. A suitable conducting material (e.g. Pt or Ir) is normally selected for the floating gate 28 to allow the deposition of the ferroelectric thin film and to prevent diffusion of the ferroelectric material into the gate dielectric and the channel. The floating gate layer 28 is also called bottom electrode, or bottom gate, in reference to the other gate electrode 11, called top electrode, or top gate. The basic drawback for this ferroelectric transistor design is the possible floating gate effect, caused by the insulation of the gate dielectric.

Other interfacial layers can be employed to improve the ferroelectric/silicon interfacial problem such as the formation of a Schottky diode such as a metal-ferroelectric-metal silicon (MFMS) device disclosed in Nakao et al., U.S. Pat. No. 5,303,182, entitled "Nonvolatile semiconductor memory utilizing aferroelectricfilm". A thin metal layer is position between the ferroelectric layer and the silicon substrate, and a Schottky barrier is formed between this metal layer and the silicon substrate. To prevent shortage between the gate and the source/drain regions, the Schottky ferroelectric gate memory transistor requires a space between the bottom electrode and the source and drain regions or a very shallow n-channel under the gate, therefore the drive current of the Schottky ferroelectric gate memory transistor can be relatively low. Hsu et al., U.S. Pat. No. 5,731,608, entittled "One transistor ferroelectric memory cell and method of making the same", and its continuations and divisions (U.S. Pat. Nos. 5,962,884; 6,117,691; 6,018,171; 5,942,776; 5,932,904; 6,146,904; 6,011,285; 6,531,325), hereby incorporated by reference, disclose a distance between 50 to 300 nm from the bottom metal electrode to the source and drain to reduce the possible high leakage current due to the increased field intensity at the metal edge of the Schottky diode because of the sharp edge at the periphery of the metal contact. Alternatively, Willer et al., U.S. Pat. No. 6,538,273, entittled "Ferroelectric transistor and method for fabricating it", discloses a recess of the source and drain below the surface of the semiconductor surface in a Schottky ferroelectric gate memory transistor.

An interfacial layer of conductive metal oxide can be employed in a co-pending application entitled "Conductive metal oxide gate ferroelectric memory transistor" of the same first inventor, disclosing a ferroelectric transistor having a conductive oxide in the place of the gate dielectric. By replacing the gate dielectric with a conductive oxide, the bottom gate of the ferroelectric layer is conductive through the conductive oxide to the silicon substrate, therefore there is no floating gate effect. The memory retention degradation related to the leakage current associated with the charges trapped within the floating gate is eliminated. Furthermore, the operating voltage for the ferroelectric transistor can be reduced to the ferroelectric layer programming voltage because of the absence of the gate dielectric.

Another co-pending application entitled "$In_2O_3$ thin film resistivity control by doping metal oxide insulator for MFMox device applications" of the same first inventors, has also disclosed a novel interfacial layer design by the use of a resistive oxide film in place of the gate dielectric, fabricated with proper resistance value to optimize the performance of the ferroelectric transistor. By replacing the gate dielectric with a resistive oxide film, and by optimizing the value of the film resistance, the bottom gate of the ferroelectric layer is electrically connected to the silicon substrate, therefore the floating gate effect can be eliminated, resulting in the improvement of the memory retention char-acteristics. Furthermore, the operating voltage for the ferroelectric transistor can be reduced because of the absence of the gate dielectric.

The disclosed conductive oxide is preferably a conductive metal oxide, but can be a conductive oxide without any metal components. The conductive oxide can make good interface with the silicon substrate, and can be selected to have a good lattice matching with the deposited ferroelectric film, especially ones having perovskite crystal structures.

Furthermore, a conductive oxide serving as electrodes for the ferroelectric film may improve the quality of the ferroelectric film, and thus the operation of the ferroelectric transistor. A ferroelectric film is generally formed in an oxidizing ambience such as a deposition process with oxygen as a reactive gas, or an annealing process in an oxygen ambience to improve the stability of the deposited ferroelectric film. Therefore the electrode material for a ferroelectric film is preferable an oxidization resistant noble metal such as Pt and Ir. Conductive oxides is already oxidation resistant, and further, due to the high concentration of oxygen, the conductive oxide film can suppress the movement and accumulation of oxygen at the ferroelectric/conductive oxide interface to improve the reliability such as fatigue and the controllability of the ferroelectric and therefore its polarization property.

One further advantage of conductive metal oxide is the etch selectivity. Oxygen can be used as an etching gas for conductive metal oxides since a steam pressure of metal oxide is typically very high. The conductive metal oxide therefore can be etched with high selective etching rate to other dielectric films. In addition, the conductive metal oxide and the metal can have high selective etching rate since the conductive metal oxide films ($RuO_2$, for example) normally cannot easily react with halogen such as F and Cl used for etching the metal films.

Under proper conditions, the conductive metal oxide disclosed above can behave as a semiconductor as utilized extensively in various gas sensor applications. The present invention thus discloses a semiconductor metal oxide ferroelectric memory transistor, taking the advantages of a good interface between a semiconductive metal oxide and a ferroelectric layer. Further, by using a semiconductive metal oxide material as the device channel, the present invention transistor can be fabricated either horizontally or vertically planar, as well as able to stack many layers of devices in a 3D structure.

Figure 3:
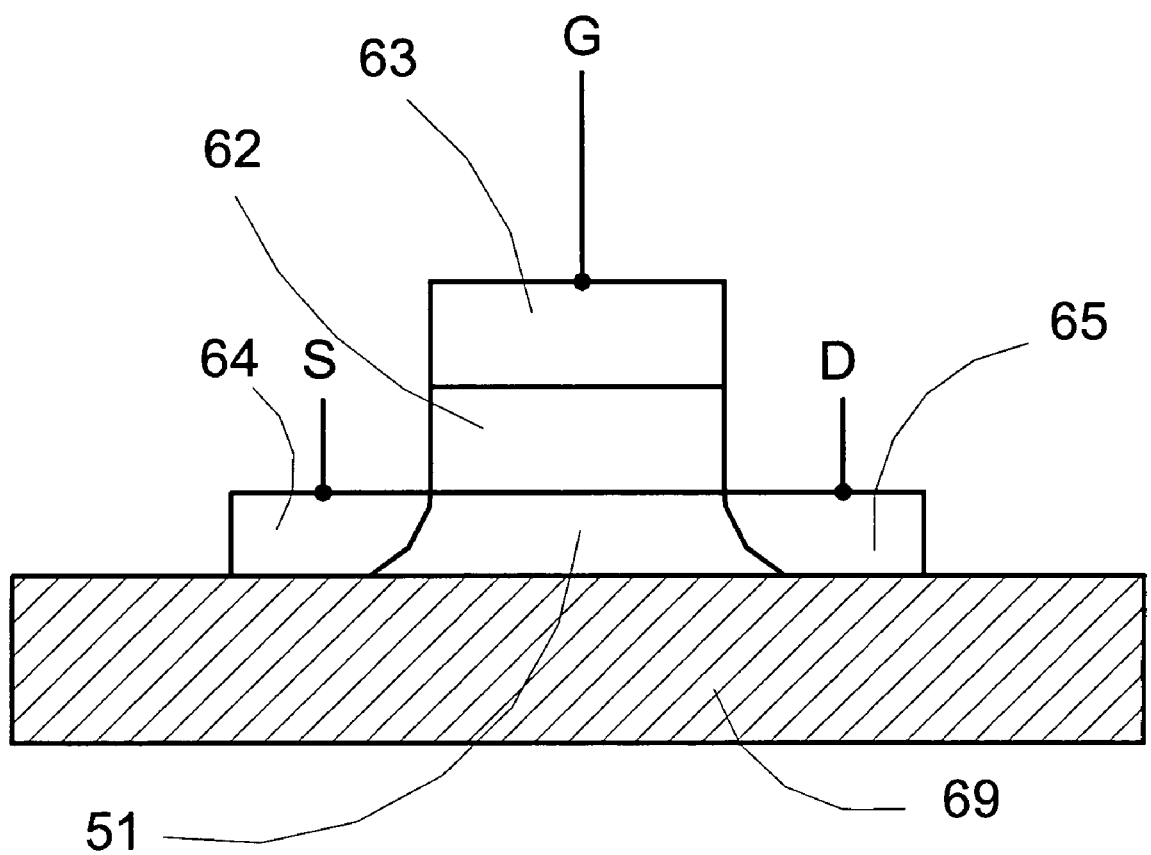
FIG. 3 shows a schematic of the present invention semiconductive metal oxide ferroelectric transistor.

The first embodiment of the present invention is shown in FIG. 3, illustrating a semiconductive metal oxide ferroelectric transistor. The gate stack of the present invention comprises a top gate electrode 63 and a ferroelectric film 62, positioning on a semiconductive metal oxide layer 51 disposed on a substrate 69, and disposed between the source 64 and drain 65 regions having a high concentration of opposite type impurity ions. The ferroelectric transistor is isolated by the isolation substrate 69. The conductive channel layer of the present invention transistor is fabricated with a semiconductive metal oxide such as $In_2O_3$ $_{or\ RuO_2}$. The semiconductive metal oxide in this example can be doped with p-type (n-type) impurities to form n-type (p-type) semiconductive metal oxide material.

Figure 4A:
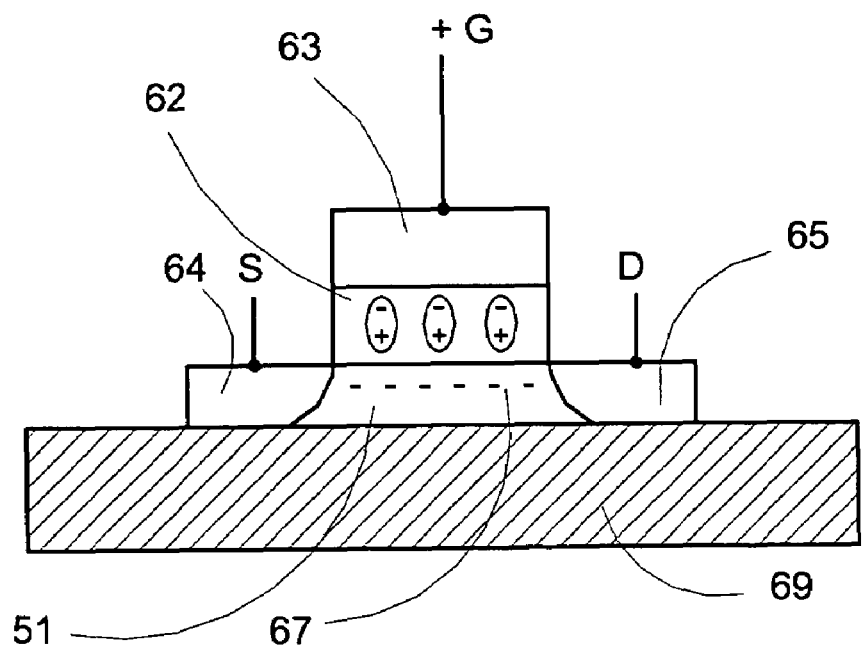
FIGS. 4A-B shows the operation of the present invention semiconductive metal oxide ferroelectric transistor.

FIG. 4 show the operation of an n-channel semiconductive metal oxide ferroelectric transistor. In FIG. 4A, when a positive voltage is applied to the gate electrode 63, polarization of the ferroelectric film 62 occurs with electrons are pulled to the top and holes are pulled to the bottom of the ferroelectric film. Electrons are then accumulated at the bottom electrode and the surface of the silicon under the ferroelectric gate stack. This forms a high conductive channel 67. Therefore the ferroelectric transistor is "ON", i.e. if a voltage bias is placed across the source 64 and the drain 65, a current will flow through the transistor. The ferroelectric transistor memory is nonvolatile, meaning that the transistor remains in the ON state even after this positive voltage is removed due to the remnant polarization of the ferroelectric film 62.

Figure 4B:
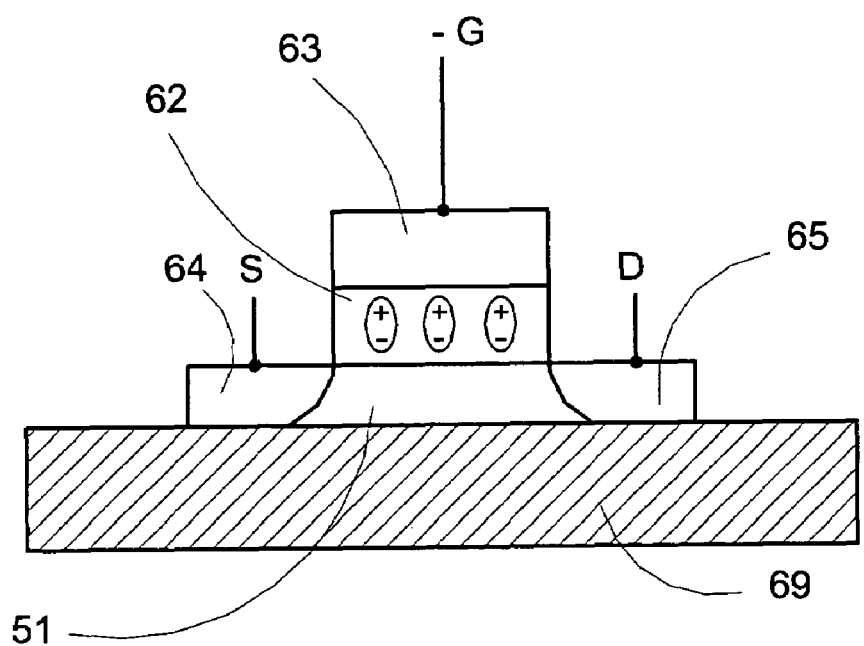

In FIG. 4B, when a negative voltage is applied to the gate electrode 63, opposite polarization occurs in the ferroelectric film 62 with holes are pulled to the top of the ferroelectric gate and electrons are pulled to the bottom of the ferroelectric film. Holes then are accumulated at the bottom electrode and the surface of the silicon under the ferroelectric gate stack. There are no conduction channel 67, and the ferroelectric transistor is "OFF", i.e. a non-conduction state takes place between the source 64 and drain 65 regions, which is maintained even after the negative voltage is removed.

Figure 5:
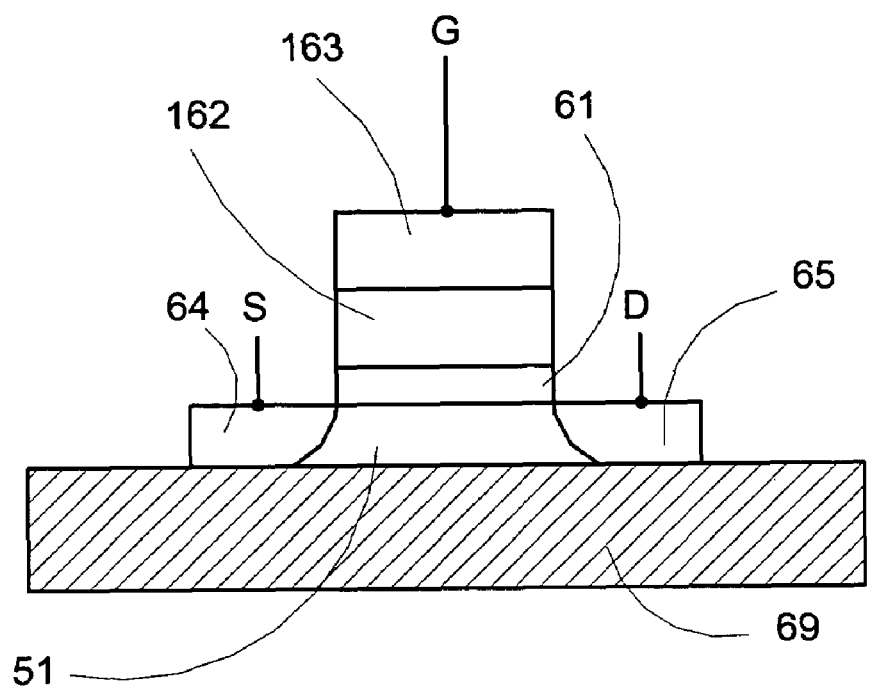
FIG. 5 shows another embodiment of the present invention semiconductive metal oxide ferroelectric transistor having a gate stack of top electrode/ferroelectric/bottom electrode disposed on a semiconductor metal oxide channel.

In the second embodiment of the invention, a bottom gate electrode is included. Thus gate stack of the semiconductive metal oxide gate ferroelectric transistor comprises a top gate electrode 163, a ferroelectric film 162 and a bottom gate electrode 61 as shown in FIG. 5. The bottom electrode 61 is connected to the semiconductive metal oxide channel 51, and therefore the bottom electrode 61 is not electrically isolated, and would not be able to accumulate charges likes a floating gate. The charge retention time of this device is thus independent of the current flow through the ferroelectric thin film.

Figure 6:
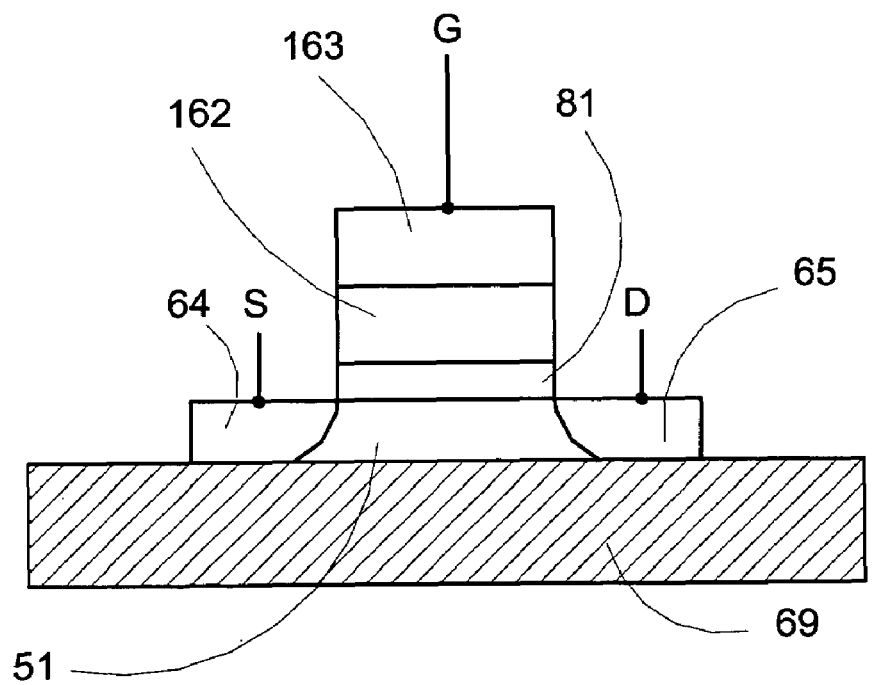
FIG. 6 shows another embodiment of the present invention semiconductive metal oxide ferroelectric transistor having a gate stack of top electrode/ferroelectric/gate dielectric disposed on a semiconductor metal oxide channel.
Figure 7:
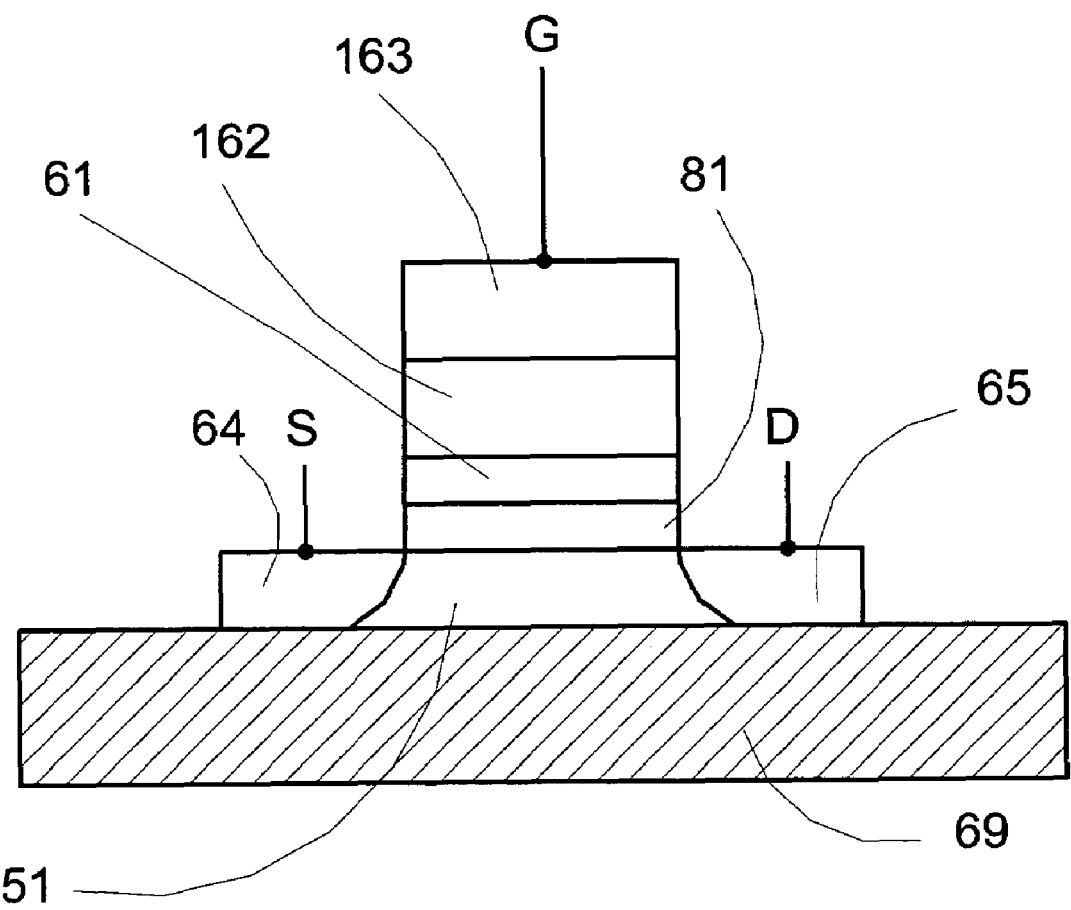
FIG. 7 shows another embodiment of the present invention semiconductive metal oxide ferroelectric transistor having a gate stack of top electrode/ferroelectric/bottom electrode/gate dielectric disposed on a semiconductor metal oxide channel.

In alternate embodiments of the invention, a gate dielectric is included. Thus gate stack of the semiconductive metal oxide gate ferroelectric transistor comprises a top gate electrode 163, a ferroelectric film 162 and a gate dielectric 81 as shown in FIG. 6, or a top gate electrode 163, a ferroelectric film 162, a bottom electrode 61 and a gate dielectric 81 as shown in FIG. 7. The gate dielectric can also be a resistive material as disclosed in a co-pending application entitled "$In_2O_3$ thin film resistivity control by doping metal oxide insulator for MFMox device applications".

The semiconductive metal oxide in the present invention is preferably a metal oxide exhibiting semiconducting properties, such as indium oxide ($In_2O_3$), ruthenium oxide ($RuO_2$), tungsten oxide ($WO_3$), molybdenum oxide ($MoO_3$), titanium oxide ($TiO_2$), tin oxide ($SnO_2$), iron oxide ($Fe_2O_3$), cesium oxide ($CeO_2$), zinc oxide ($ZnO_2$), gallium oxide ($Ga_2O_3$), $SrTiO$, $LaFeO_3$, $Cr_{1.8}Ti_{0.2}O_3$.

The semiconductive metal oxide film can also be an oxide film of any one metal selected from a group of Mo, W, Tc, Re, Ru, Os, Rh, Ir, Pd, Pt, In, Zn, Sn, Sr—Ru or Sr—Co (such as $IrO_2$ and $RuO_2$), or a rock-salt (NaCl) crystal structure face-centered cubic metal oxide, such as NdO, NbO, SmO, LaO, and VO. The preferred method of forming the semiconductive metal oxide is by deposition. However, other methods may be used such as doping by diffusion and ion implantation. For example, the semiconductive metal oxide can be boron (B) doped or fluorine (F) doped ZnO and antimony (Sb) doped or fluorine (F) doped $SnO_2$.

The semiconductive metal oxide may be composed of any number of conductive perovskite oxides such as lanthanum strontium cobalt oxide (LSCO). Typical examples of simple perovskite oxides are expressed by the general formula $ABO_3$ such as $SrRuO_3$ or $LaNiO_3$, where AB can be any combination of (A=Ca, Sr)(B=V, Cr, Fe, Ru), (A=La)(B=Ti, Co, Ni, Cu), (A=H, Li, Na, K)(B=Re, Mo, Nb), (A=$La_{1-x}Sr_x$)(B=V, Mn, Co). Another example of conductive perovskite oxides is expressed by the general formula $A_2B_2O_7$ where (A=Bi, Pd)(B=$Ru_{1-x}Bi_x$, $Ru_{1-x}Pb_x$). Examples of layered perovskite oxides include $CaTiO$, $(Sr(Ru, Ir, Cr)O_3)(SrO)_n$ such as $SrRuO_3$, $SrIrO_3$, $Sr_2RuO_4$, $Sr_2IrO_4$ and $Ba_2RuO_4$. The semiconductive metal oxide film can also include high temperature superconducting oxides such as $La_{1-x}Sr_xCuO_4$, $Nd_{1-x}Ce_xCuO_4$, $YBa_2Cu_3O_7$, $Bi_2Sr_2Ca_{n-1}Cu_nO_{2n+4}$, $(Nd_{1-x}Ce_x)_2CuO_4$. See, for example, Suzuki, U.S. Pat. No. 6,151,240, entitled "Ferroelectric nonvolatile memory and oxide multi-layered structure", hereby incorporated by reference.

The ferroelectric material disclosed in the present invention is preferably any of the following: $Pb(Zr, Ti)O_3$ (PZT), $SrBi_2Ta_2O_9$ (SBT), $Pb_5Ge_3O_{11}$(PGO), $BaTiO_3$, $LiNbO_3$, STO, BST, BSTO, SBTN, PLT or PLZT, but any ferroelectric material exhibiting hysteresis effect can be employed in the conductive oxide ferroelectric transistor. The preferred ferroelectric compounds are, in order of preference, PGO, SBT and PZT. The ferroelectric layer is preferably capped with a passivation layer such as silicon nitride ($Si_3N_4$) or aluminum oxide ($Al_2O_3$) to prevent hydrogen reaction.

The bottom electrode and the top electrode are preferably a metal layer such as aluminum, platinum or iridium, and more preferably a conductive layer, a conductive oxide layer, a conductive metal oxide layer, or a multilayer such as conductive oxide/metal, or conductive metal oxide/metal.

Within the scope of the invention, the disclosed semiconductive metal oxide ferroelectric transistor structure may also incorporate all the advanced features of the state of the art technology such as SOI or SIMOX substrate, halo or LDD source and drain, sidewall spacers for the gate stack, shallow trench isolation (STI) or LOCOS isolation, silicide formation such as titanium silicide, cobalt silicide, or nickel silicide, raised source and drain, passivation, tungsten or aluminum contact, aluminum or copper metallization.

The present invention further discloses the fabrication process for the semiconductive metal oxide ferroelectric transistor. Although the fabrication process for the semiconductive metal oxide ferroelectric transistor is illustrated and described below with reference to certain specific processes, the present invention is nevertheless not intended to be limited to the details shown. The general process of semiconductor fabrication has been practiced for many years, and due to the multitude of different ways of fabricating a device or structure, various modifications may be made in the fabrication process details within the scope and range of the present invention and without departing from the meaning of the invention.

One fabrication process for the semiconductive metal oxide ferroelectric transistor is a gate etching process, employing an etching process to form the gate stack and comprising the steps of:

Preparing a semiconductor metal oxide channel layer

Forming a gate stack on the semiconductor metal oxide layer

Forming drain and source regions on opposite sides of the gate stack in the semiconductor metal oxide.

The device fabrication process is then completed with passivation and interconnect metallization steps. After passivation, another device can also fabricated on top of the previous device to form 3D memory structure.

Figure 8A:
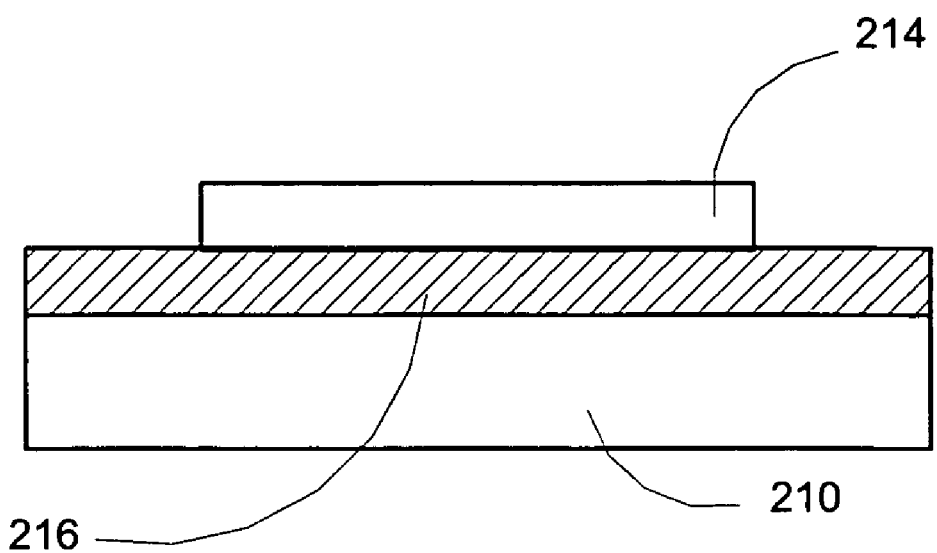
FIGS. 8A-F shows a representative fabrication process for gate etching process.

Preparing a Semiconductor Substrate, FIG. 8A:

The fabrication process starts with a substrate (silicon wafer substrate, glass substrate, compound Semiconductor substrate, or any suitable substrate), preferably a silicon substrate. A thin dielectric layer is deposited on the substrate to provide device isolation. The dielectric layer is preferably a silicon dioxide, deposited either by thermal oxidation process or a deposition process (sputtering process or chemical vapor deposition process such as plasma enhanced chemical vapor deposition process, or low pressure chemical vapor deposition process). The thickness of the dielectric layer is preferably between 50 nm to 200 nm. If a dielectric substrate (such as a glass substrate) is used, this dielectric layer might not be needed since the substrate already provides the needed device isolation. Then a thin layer of semiconductive metal oxide such as $In_2O_3$ or $RuO_2$ is deposited onto the dielectric layer. The thickness of the semiconductive metal oxide is preferably between 20 nm to 100 nm. The semiconductive metal oxide layer is preferably properly doped with suitable impurities to achieve the right dopant and dopant concentration. The semiconductive metal oxide layer is then patterned to form active device areas. The patterning process is preferably photolithography process in which a photoresist mask is used to etch the semiconductive metal oxide layer, leaving islands for active device fabrication.

FIG. 8A shows a substrate 210 and a dielectric layer 216, together with an active device area 214 of semiconductive metal oxide material. For simplicity, important but unrelated details is not shown, such as periphery devices and active region threshold voltage adjustment.

Figure 8B:
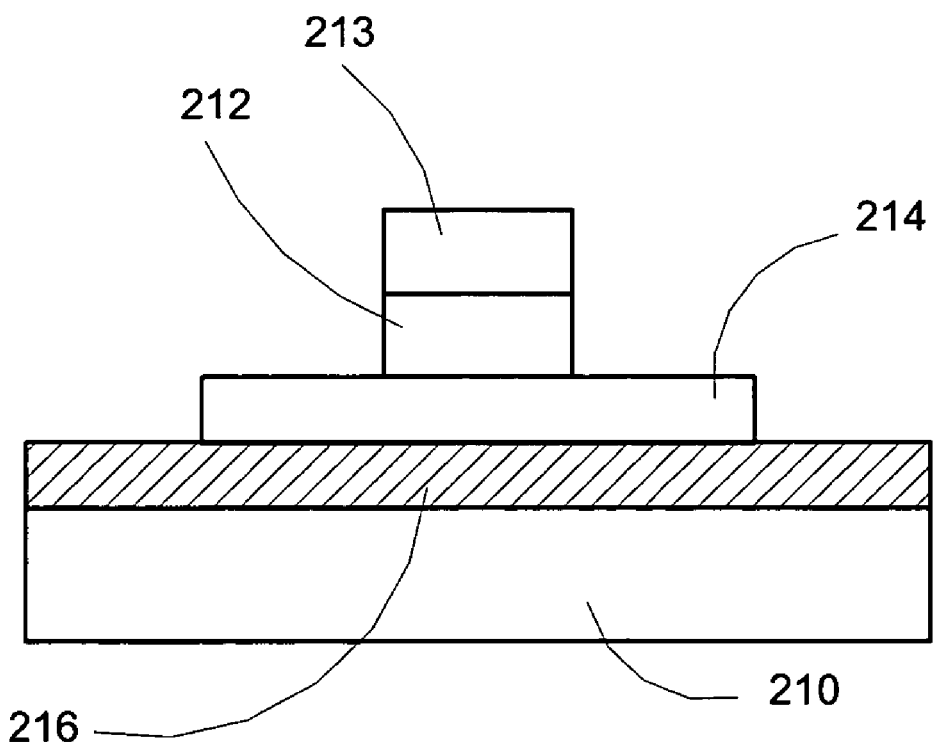
Figure 8C:
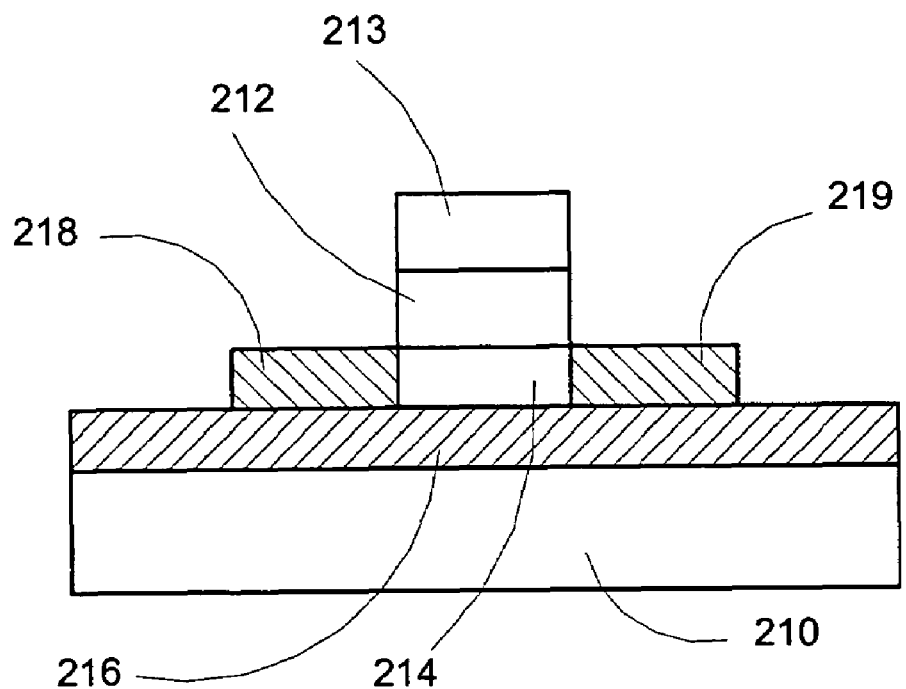

Forming a Gate Stack on the Substrate, FIG. 8B:

Then the gate stack multilayer of ferroelectric film/top electrode is deposited. In alternate embodiments of the invention, a bottom electrode and/or a gate dielectric can be added, and the gate stack multilayer can comprise three or four layers of optional gate dielectric, optional bottom electrode, ferroelectric film, and top electrode. The gate dielectric is preferably between 3 to 50 nm thick and is preferably silicon oxide, silicon nitride or any dielectric materials such hafnium oxide, aluminum oxide. The ferroelectric layer is preferably between 50 to 300 nm thick and is preferably PGO, PZT, STO, BST, BSTO, SBT, SBTN, PLT or PLZT, but can be any ferroelectric material exhibiting hysteresis effect. The top and bottom electrode is preferably between 50 to 200 nm thick and is preferably aluminum, platinum or iridium, but also can be any conductive metal or conductive oxide materials. Furthermore, the electrode layers (either the bottom or the top electrode) can be a multilayer of metal and conductive oxide.

The gate stack multilayer is then patterned into a ferroelectric gate stack, for example a top electrode 213 and a ferroelectric 212 as shown in FIG. 8B. The patterning of the gate stack multilayer is preferably by photolithography where a patterned mask is provided on the gate stack multilayer, then the gate stack multilayer is etched according to the pattern mask, and then the patterned mask is removed. The patterned mask is preferably a photoresist layer, coated and exposed to UV light under a photo mask to transfer a pattern from the photo mask onto the photoresist. The photoresist mask protects the gate stack multilayer during an etch step to transfer the pattern from the photoresist onto the gate stack multilayer. And then the photoresist mask can be stripped. The gate stack multilayer etching is preferably accomplished by reactive ion etching or by wet etches.

Figure 8D:
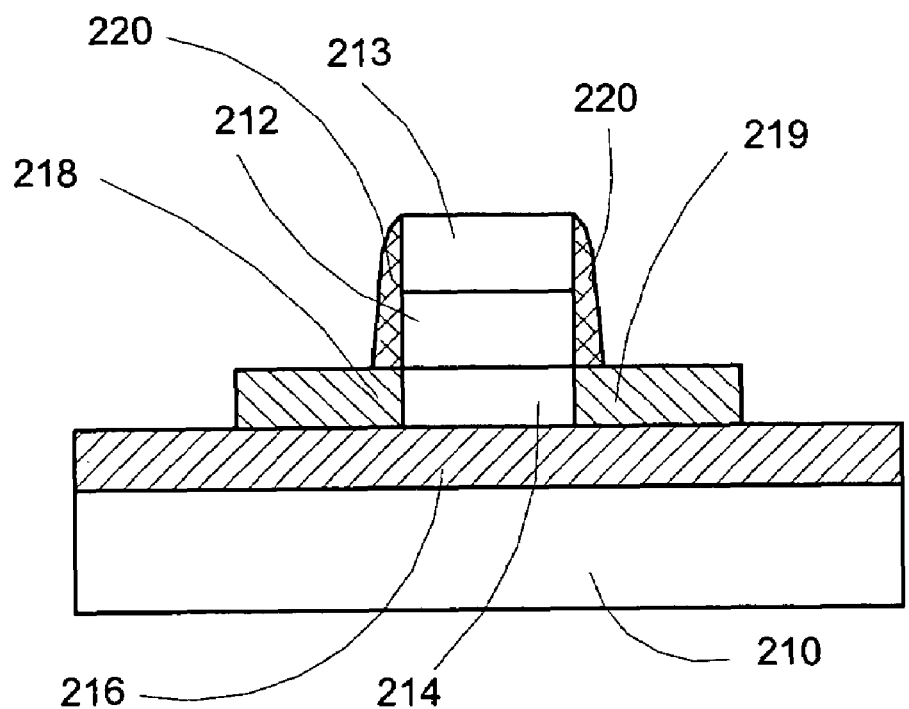

The next step is low doping drain (LDD) ion implantation into source 218 and drain 219 regions, although the ferroelectric memory transistor may or may not requires this LDD ion implantation. The next step is sidewall spacer formation. A layer of dielectric material such as silicon nitride, silicon dioxide or aluminum oxide is deposited onto the gate stack to a thickness of about between 20 to 80 nm, and then is anisotropic etched to leave a dielectric sidewall spacer 220 on the ferroelectric gate stack (FIG. 8D). The sidewall spacer can be used to protect the ferroelectric material from property degradation such as hydrogen diffusion.

Figure 8E:
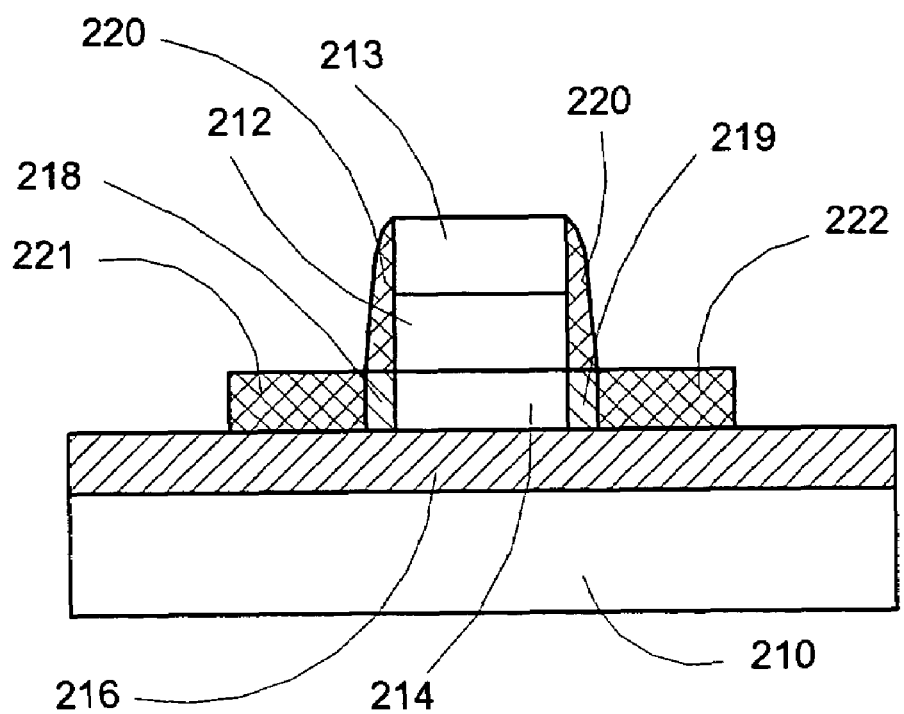

Forming Drain and Source Regions on Opposite Sides of the Gate Stack, FIG. 8E.

Figure 8F:
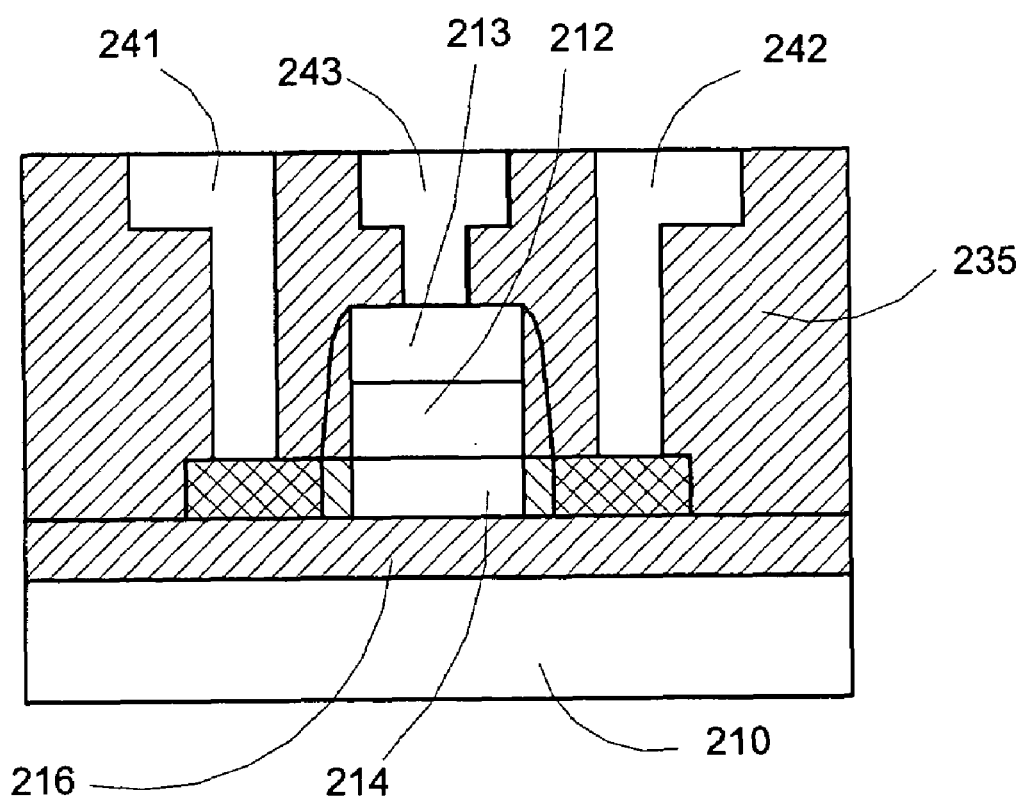

Then a source region 221 and a drain region 222 are formed by implantation of doping ions (FIG. 8E). The device fabrication process is then completed with passivation and interconnect metallization steps, FIG. 8F. A passivation layer 235 such as silicon dioxide is deposited on the whole structure to a thickness of about 1000 to 2000 nm. The passivation layer may be planarized to improve the topology of the substrate. The structure is then annealed at a temperature of between about 400° C. to 500° C. for about 15 to 60 minutes. The passivation layer is then patterned, preferably by photolithography, to form contact holes, and then the fabrication process continued with first level metallization contact 241 to source 221, contact 243 to gate stack (top electrode 213, and ferroelectric 212), contact 242 to drain 222.

The gate etching process for the alternative embodiments of the present invention (the ferroelectric transistor with the gate stack of bottom electrode and/or gate dielectric) is similar to the above gate etching process, with the addition of the bottom gate electrode and gate dielectric steps.

Alternatively, the ferroelectric gate stack may be fabricated by a replacement gate process similar to Hsu et al., U.S. Pat. No. 6,274,421, entitled "Method of making metal gate sub-micron MOS transistor", hereby incorporated by reference. The fabrication process uses a replacement process to form the gate stack and comprises the steps of:

Preparing a semiconductor substrate

Forming a replacement gate stack comprising a sacrificial layer

Forming drain and source regions on opposite sides of the replacement gate stack Filling the areas surrounding the replacement gate stack while exposing a top portion of the replacement gate stack Removing the sacrificial layer portion of the replacement gate stack Forming the remainder of the gate stack.

The device fabrication process is then completed with passivation and interconnect metallization steps.

Figure 9A:
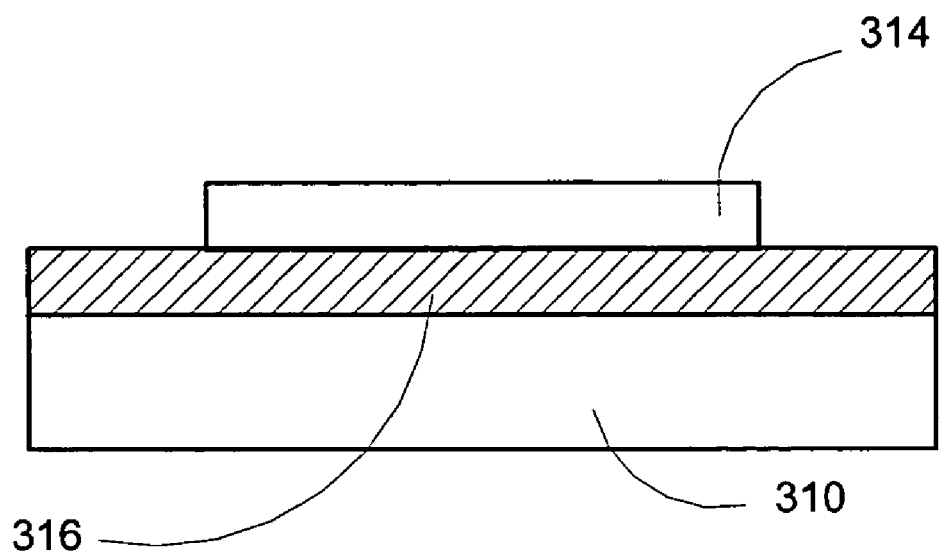
FIGS. 9A-J shows a representative fabrication process for replacement gate process.

Preparing a Semiconductor Substrate, FIG. 9A:

Similar to the gate etching process, the fabrication process starts with preparing a substrate (silicon wafer substrate, glass substrate, compound semiconductor substrate, or any suitable substrate), preferably a silicon substrate. A thin dielectric layer is deposited on the substrate to provide device isolation. The dielectric layer is preferably a silicon dioxide either by thermal oxidation process or a deposition process (sputtering process or chemical vapor deposition process such as plasma enhanced chemical vapor deposition process, low pressure chemical vapor deposition process). The thickness of the dielectric layer is preferably between 50 nm to 200 nm. If a dielectric substrate (such as a glass substrate) is used, the dielectric layer might not be needed. Then a thin layer of semiconductive metal oxide such as $In_2O_3$ or $RuO_2$ is deposited onto the dielectric layer. The thickness of the semiconductive metal oxide is preferably between 20 nm to 100 nm. The semiconductive metal oxide layer is then patterned to form active device areas. The patterning process is preferably photolithography process in which a photoresist mask is used to etch the semiconductive metal oxide layer, leaving islands for active device fabrication.

FIG. 9A shows a substrate 310 and a dielectric layer 316, together with an active device area 314 of semiconductive metal oxide material. For simplicity, important but unrelated details is not shown, such as periphery devices, possible well formation process and active region threshold voltage adjustment.

Figure 9B:
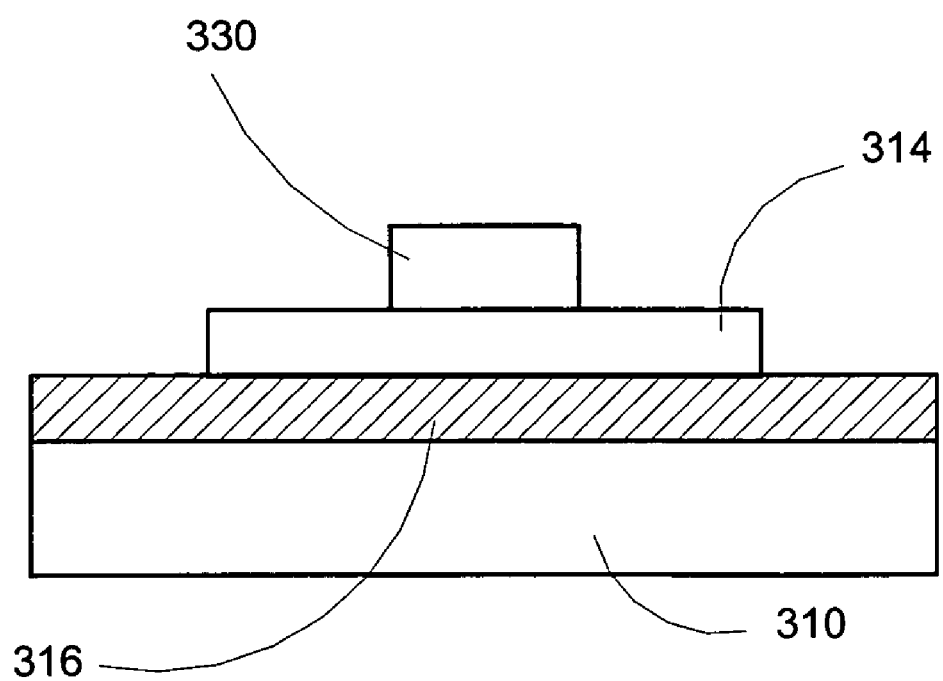

Forming a Replacement Gate Stack Comprising a Sacrificial Layer on the Substrate, FIG. 9B:

Then the multilayer replacement gate stack is deposited. The replacement gate stack serves as a place holder for the continued fabrication of the device, and will be removed before the fabrication of the functional gate stack. Thus the multilayer replacement gate stack comprises a sacrificial gate replacement layer. In other embodiments of the invention where a bottom electrode or a gate dielectric of the gate stack is included, the replacement gate stack comprises also a bottom electrode or a gate dielectric of the multilayer gate stack. The sacrificial gate replacement layer is preferably between about 50 to 200 nm thick and is preferably silicon nitride or silicon dioxide. Since the sacrificial gate replacement layer serves as a place holder for the functional gate stack, the thickness of the sacrificial layer is partially determined by the total thickness of the remainder of the functional gate stack.

The replacement gate stack multilayer is then patterned into a ferroelectric gate stack, comprising a replacement gate layer 330 as shown in FIG. 9B. The patterning of the gate stack multilayer is preferably by photolithography and reactive ion etching.

The next step is optional low doping drain (LDD) ion implantation, and possible sidewall spacer formation, although the ferroelectric memory transistor may or may not requires this LDD ion implantation.

Figure 9C:
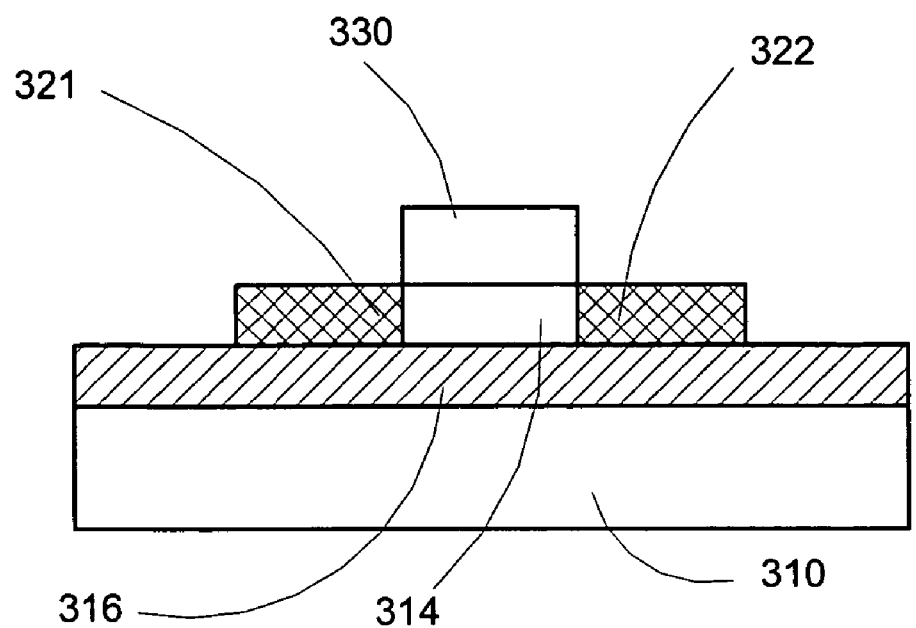
Figure 9D:
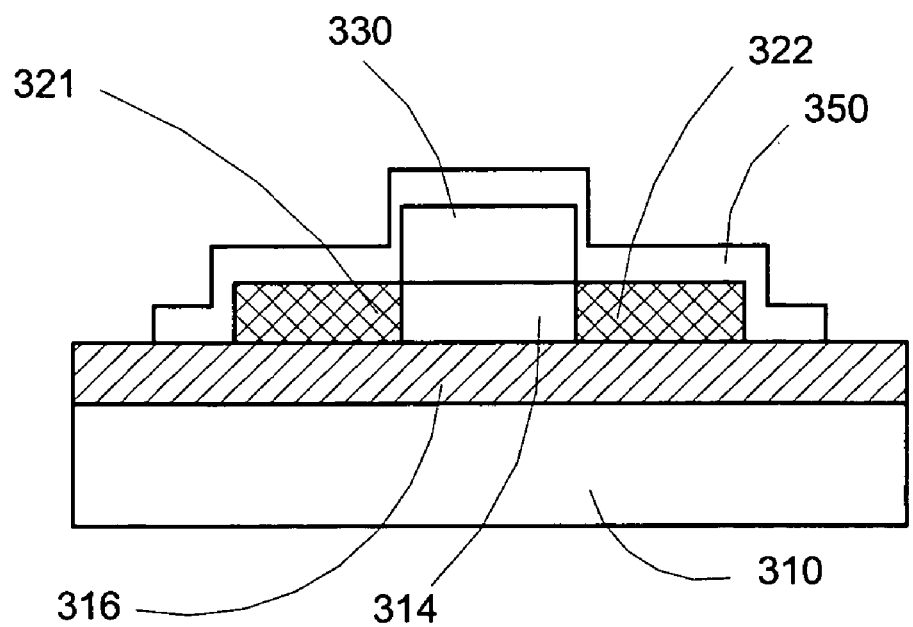

Forming drain and source regions on opposite sides of the replacement gate stack, (FIG. 9C):

Then a source region 321 and a drain region 322 are formed by implantation of doping ions. Contacts for the source and drain regions can be fabricated with a thin layer of metal 350 such as Pt, Ir, Ti, TiN, TaN, or a multilayer of these metal materials. The metal layer is preferably deposited by a directional technique such as sputtering process. The sputtering process deposits a uniform layer of metal on the flat surface with little or even no metal being deposited onto the vertical sidewall of the silicon nitride sacrificial gate. Photolithography using photoresist mask can be used to etch metal from the non-active area (FIG. 9D).

Figure 9E:
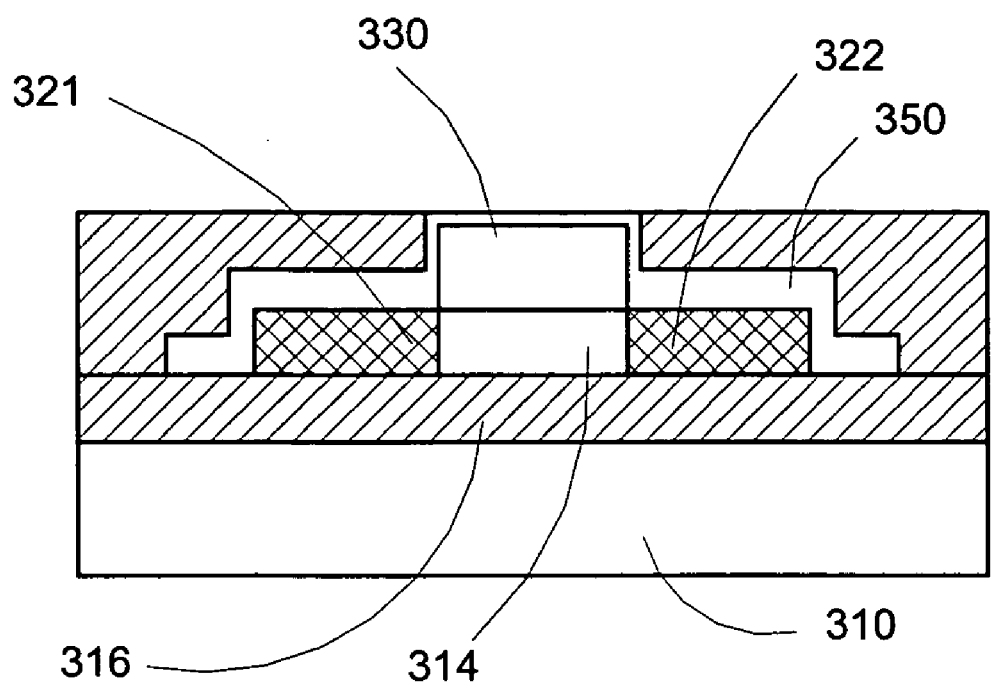

Filling the Areas Surrounding the Replacement Gate Stack While Exposing a Top Portion of the Replacement Gate Stack, FIG. 9E:

A dielectric layer 335 such as silicon dioxide is deposited on the whole structure. The dielectric layer is then planarized, preferably by a chemical mechanical polishing (CMP) process. The thickness of the dielectric layer is preferably about 50% thicker than the replacement gate layer 330 and the semiconductive metal oxide, 314 to prevent dishing during planarization. The CMP process stops at the metal layer 350 on the silicon nitride sacrificial gate, and the metal on the sacrificial gate may or may not be completely removed (FIG. 9E).

Figure 9F:
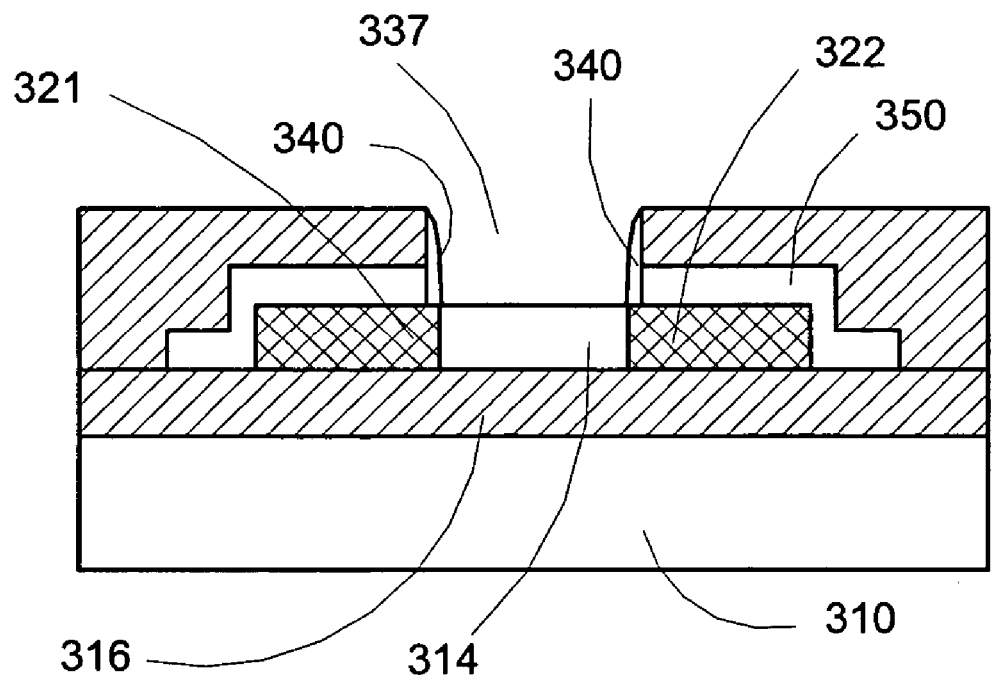

Removing the Sacrificial Layer Portion of the Replacement Gate Stack, FIG. 9F:

The replacement gate layer 330 and the remaining metal layer 350 are removed to expose a gate trench 337, preferably by a selective wet etch process to prevent damage to the surrounding structure. The metal at the sidewall of the gate trench is removed also with a wet etch process.

A spacer 340 is fabricated in the sidewall of the gate trench to protect the ferroelectric gate stack. The spacer formation is preferably by depositing a layer of silicon nitride or aluminum oxide of about 5 to 20 nm thick, and then anisotropically etched by plasma reactive ion etching (FIG. 9F).

Figure 9G:
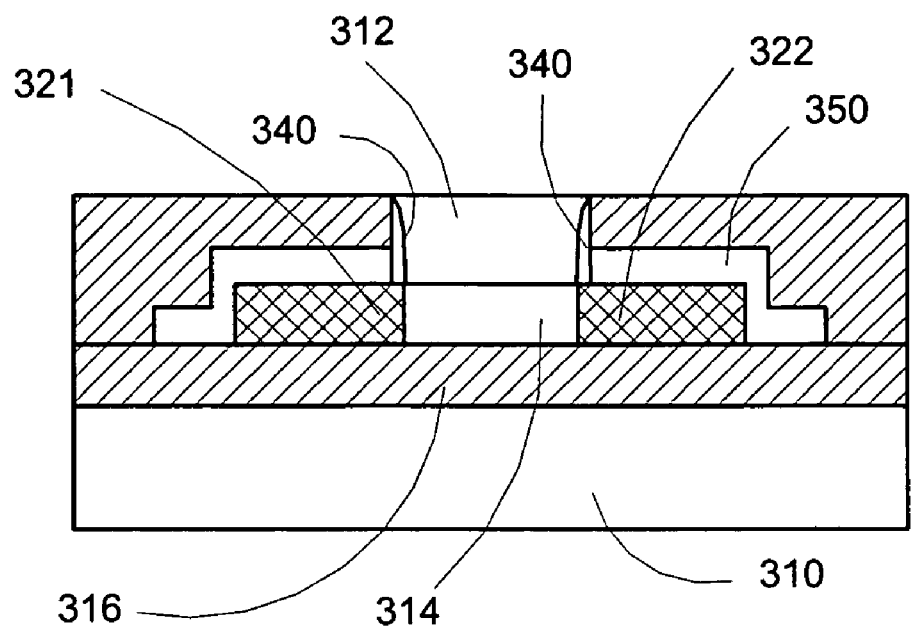
Figure 9H:
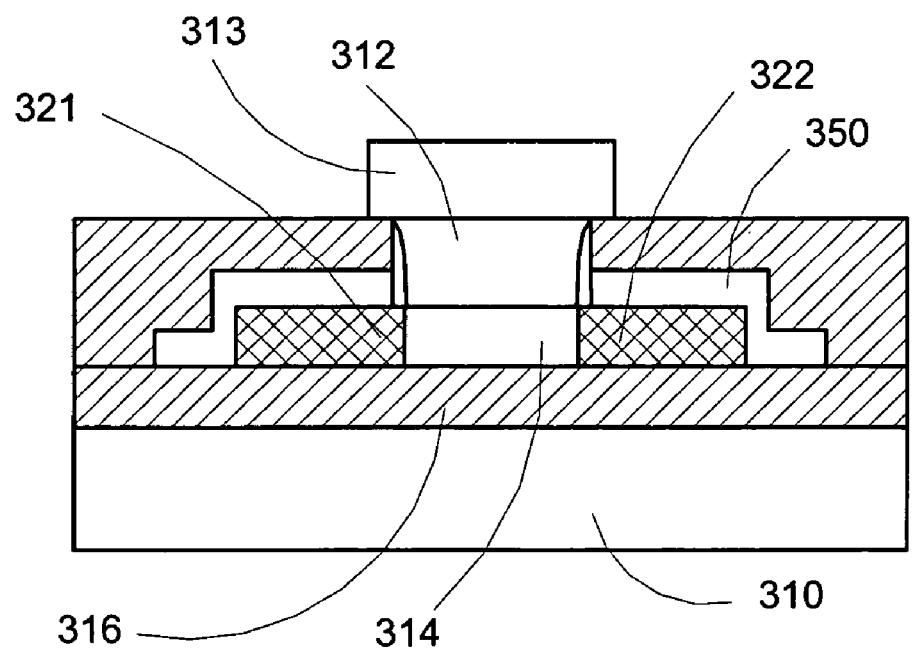

Forming the Remainder of the Gate Stack, FIG. 9H:

The ferroelectric layer is then deposited into the gate trench. The ferroelectric layer is perferably PGO, PZT, STO, BST, BSTO, SBT, SBTN, PLT or PLZT, but can be any ferroelectric material exhibiting hysteresis effect. The thickness of the ferroelectric layer is preferably slightly thicker than the depth of the gate trench to minimize the dishing effect during the subsequent CMP process of planarize the ferroelectric layer 312 (FIG. 9G).

The top electrode is then fabricated on the ferroelectric layer 312. The top electrode formation is preferably by depositing a blanket layer of top electrode material, and then is patterned into the top electrode, preferably by photolithography and reactive ion etching techniques. The top electrode is preferably between 50 to 200 nm thick and is preferably aluminum, platinum or iridium, but also can be any conductive materials (FIG. 9H).

Figure 9I:
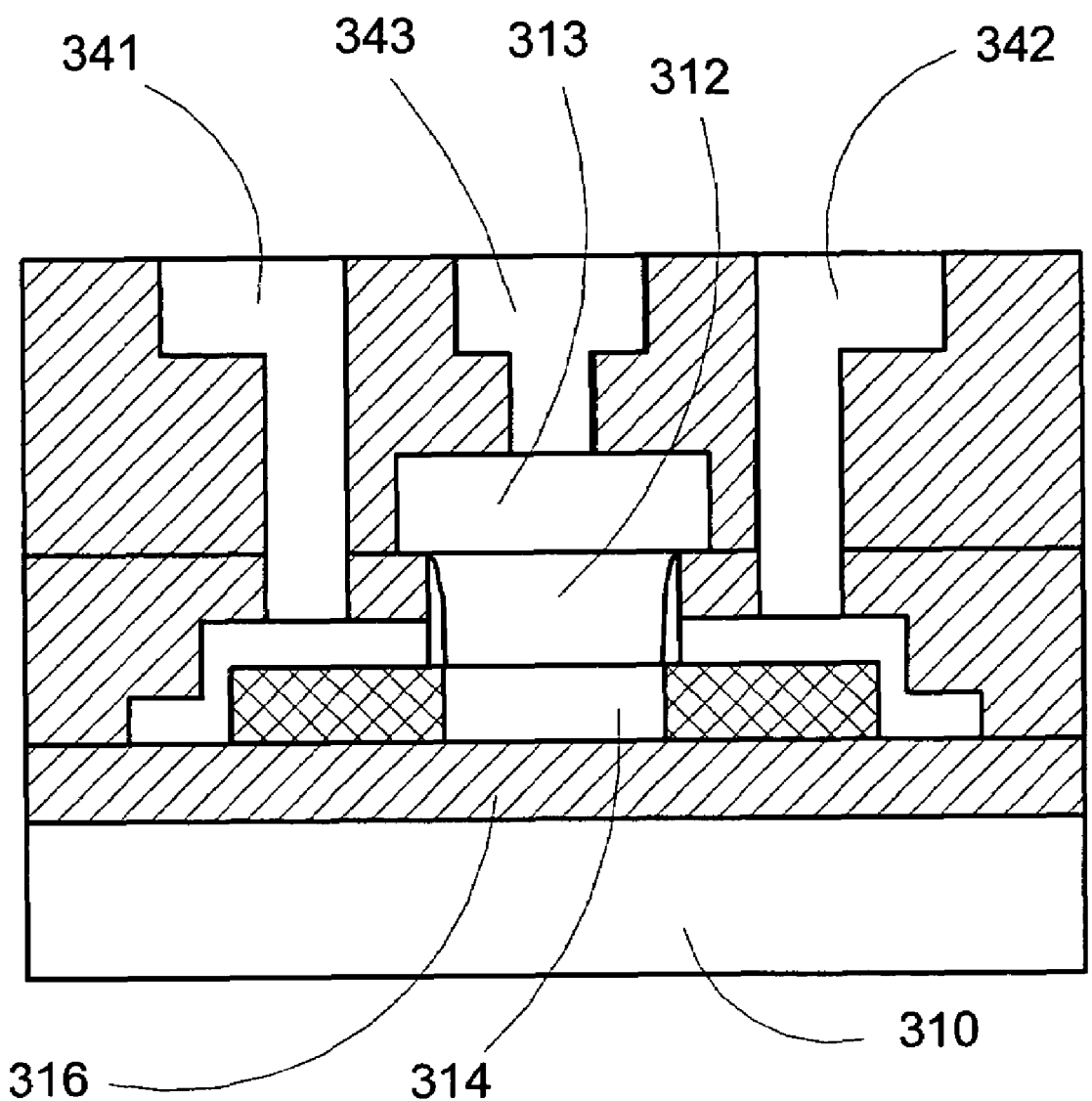

The device fabrication process is then completed with passivation and interconnect metallization steps, FIG. 9I. A passivation layer such as silicon dioxide is deposited on the whole structure to a thickness of about 300 to 500 nm. The structure is then annealed at a temperature of between about 400° C. to 500° C. for about 15 to 60 minutes. The passivation layer is then patterned, preferably by photolithography, to form contact holes, and then the fabrication process continued with first level metallization contact 341 to source 321, contact 343 to gate stack (top electrode 313, ferroelectric 312, bottom electrode 311 and conductive oxide 301), contact 342 to drain 322.

Figure 9J:
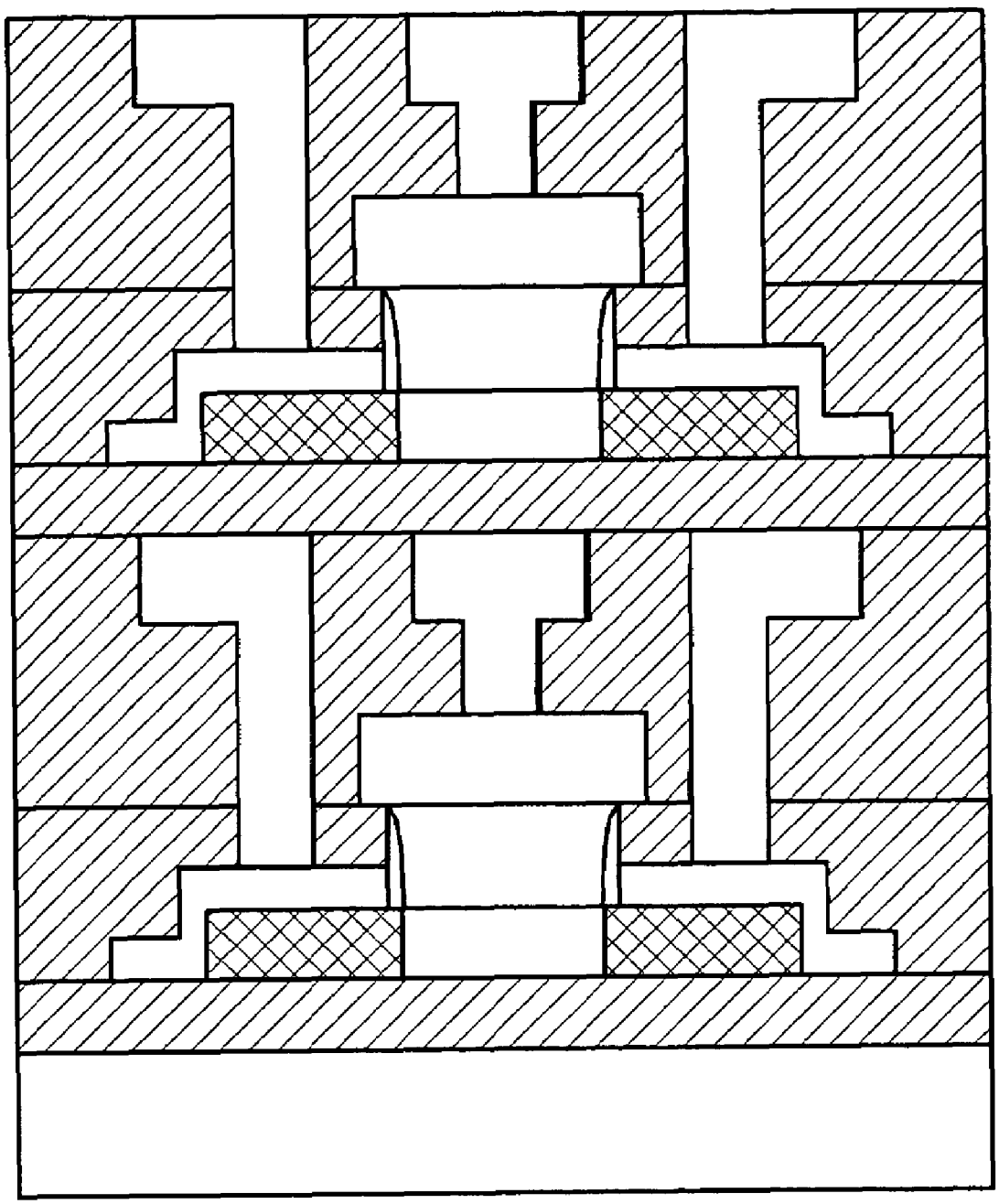

A CMP planarization step may be added to have a planar surface. The above steps can be repeated for more level memory transistor fabrication to form 3D memory structure (FIG. 9J).

The replacement gate process for the alternative embodiments of the present invention (the ferroelectric transistor with the gate stack of additional bottom electrode or gate dielectric) is similar to the above replacement process, with the exception of the addition of the bottom gate electrode or the gate dielectric steps.

Thus a novel ferroelectric transistor and its memory cell application have been disclosed, together with the method of device fabrication. It will be appreciated that though preferred embodiments of the invention have been disclosed, further variations and modifications thereof may be made within the scope of the invention as defined in the appended claims. Further, although the invention has been described with reference to a ferroelectric transistor for use with nonvolatile memory applications, other applications of the inventive concepts disclosed herein will also be apparent to those skilled in the art.

What is claimed is:

1. A method of fabricating a ferroelectric memory transistor comprising:
   preparing an isolation substrate;
   forming a semiconductive metal oxide channel layer on the isolation substrate;
   forming a replacement gate stack on the semiconductive metal oxide layer, the replacement gate stack comprising
   a sacrificial layer over the semiconductive metal oxide layer;

forming drain and source regions on opposite sides of the replacement gate stack;
filling the areas surrounding the replacement gate stack while exposing the top portion of the replacement gate stack;
removing the sacrificial layer portion of the replacement gate stack;
forming the remainder of the gate stack, the remainder of the gate stack comprising;
a ferroelectric material layer over the semiconductive metal oxide layer; and
a top electrode conductive layer over the ferroelectric material layer, and
forming drain and source regions on opposite sides of the replacement gate stack before forming any of the other recited components of the gate stack.

2. A method as in claim 1 wherein the replacement gate stack further comprises a bottom electrode conductive layer positioned between the semiconductive metal oxide layer and the sacrificial layer.

3. A method as in claim 1 wherein the replacement gate stack further campuses a gate dielectric layer positioned between the semiconductive metal oxide layer and the sacrificial layer.

4. A method as in claim 1 wherein the sacrificial layer material comprises silicon nitride or silicon dioxide.

5. A method as in claim 1 further comprising the formation of a conductive layer for source/drain contact.

6. A method as in claim 1 wherein the filling of the areas surrounding the replacement gate stack while exposing a top portion of the replacement gate stack comprises
the deposition of a dielectric film; and
the planarization of the deposited dielectric film to expose the top portion of the replacement gate stack.

7. A method as in claim 1 wherein the formation of the remainder of the gate stack comprises
deposition of the ferroelectric material layer;
planarization of the ferroelectric material layer;
deposition of the top electrode conductive layer;
photolithography patterning of the top electrode conductive layer; and
etching of the top electrode conductive layer.

8. A method as in claim 1 wherein the formation of the replacement gate stack comprises the deposition of the replacement gate stack, the photolithography patterning of the replacement gate stack and the etching of the replacement gate stack.

9. A method as in claim 1 wherein the top electrode conductive layer is a layer of a metal, taken from the group of layers consisting of a layer of conductive oxide and a multilayer of metal and conductive oxide.

10. A method as in claim 1 wherein the conductive oxide layer comprises a conductive perovskite oxide, a high temperature superconducting oxide, or an oxide film of any metal selected from a group consisting of Mo, W, Tc, Re, Ru, Os, Rh, Ir, Pd, Pt, In, Zn, Sn, Nd, Nb, Sm, La, and V.

11. A method as in claim 1 wherein the semiconductive metal oxide is selected from a group consisting of indium oxide, ruthenium oxide, tungsten oxide, molybdenum oxide, titanium oxide, inn oxide, tin oxide, zinc oxide, $CeO_2$, $Ga_2O_3$, $SrTiO_3$, $LaFeO_3$, and $Cr_xTi_yO_3$.

12. A method as in claim 1 wherein the semiconductive metal oxide layer comprises a metal oxide film of any metal selected from a group consisting of Mo, W, Tc, Re, Ru, Os, Rh, Ir, Pd, Pt, In, Zn, Sn, Nd, Nb, Sm, La, and V.

13. A method as in claim 1 wherein the ferroelectric material is selected from a group consisting of PZT, SBT, PGO, $BaTiO_3$, $LiNbO_3$, STO, BST, BSTO, SBTN, PLT and PLZT.

* * * * *